United States Patent
Kishimoto et al.

(10) Patent No.: US 7,272,055 B2
(45) Date of Patent: Sep. 18, 2007

(54) METHOD AND APPARATUS FOR TIMING ADJUSTMENT

(75) Inventors: Yoshihiro Kishimoto, Osaka (JP); Yuji Sekiguchi, Nara (JP); Yoichiro Miki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 129 days.

(21) Appl. No.: 11/269,741

(22) Filed: Nov. 9, 2005

(65) Prior Publication Data

US 2006/0140045 A1  Jun. 29, 2006

(30) Foreign Application Priority Data

Dec. 28, 2004 (JP) .............................. 2004-381496

(51) Int. Cl.
*G11C 7/00* (2006.01)

(52) U.S. Cl. ........................... 365/194; 365/193
(58) Field of Classification Search ................ 365/194, 365/193, 189.05
See application file for complete search history.

(56) References Cited

U.S. PATENT DOCUMENTS 5,930,182 A * 7/1999 Lee ............................ 365/194
6,318,707 B1 * 11/2001 Hara et al. .................... 365/233
6,335,885 B1 * 1/2002 Shimizu ........................ 365/194
7,233,533 B2 * 6/2007 Lee ............................ 365/194
2004/0044919 A1 3/2004 Dabral

FOREIGN PATENT DOCUMENTS

JP 2004-185608 A 7/2004

* cited by examiner

*Primary Examiner*—Anh Phung
(74) *Attorney, Agent, or Firm*—McDermott Will & Emery LLP

(57) ABSTRACT

A strobe signal from a memory is delayed through delay circuits of a strobe delay selection section, thus obtaining a plurality of delayed strobe signals. A strobe latch section produces check data in synchronism with each of the delayed strobe signals, and a system latch section latches, with a system clock, check data latched by the strobe latch section. Based on a comparison by an expected value comparison section and a determination by a delay determination section, the optimal strobe signal with the optimal delay is selected from among the delayed strobe signals produced in the strobe delay selection section. Then, data from the memory is delayed through delay circuits in a data delay selection section, thus obtaining a plurality of delayed data, and the optimal data with the optimal delay is selected from among the plurality of delayed data based on the comparison by the expected value comparison section and the determination by the delay determination section.

14 Claims, 13 Drawing Sheets

METHOD AND APPARATUS FOR TIMING ADJUSTMENT

CROSS REFERENCE TO RELATED APPLICATIONS

This Non-provisional application claims priority under 35 U.S.C. §119(a) on Patent Application No. 2004-381496 filed in Japan on Dec. 28, 2004, the entire contents of which are hereby incorporated by reference.

BACKGROUND OF THE INVENTION

The present invention relates to a data timing adjustment method and a data timing adjustment apparatus for adjusting data latch timing where a semiconductor device such as a memory or an LSI outputs a strobe signal and data in synchronism with the strobe signal.

Typically, timing for reading out data from a memory, an LSI, or the like (discussion hereinbelow will focus on cases where data is read out from a memory) is determined in advance when the device is designed. However, the data read timing may vary due to various factors such as the physical location of the memory, the characteristics of the memory, a voltage drop and the ambient temperature. If the readout data is latched with predetermined fixed latch timing, a data mislatch may occur. Therefore, it is necessary to adjust the timing with which readout data is latched.

With some conventional techniques, a dip switch, or the like, is provided to allow for manual adjustment of the readout data latch timing such that data output from a memory is latched properly.

This method however introduces the manual adjustment operation. In view of this, Japanese Laid-Open Patent Publication No. 2004-185608, for example, proposes a timing adjustment apparatus that automatically adjusts timing with which data read out from a memory is latched.

FIG. 13 is a block diagram showing the timing adjustment apparatus disclosed in this publication.

Referring to FIG. 13, reference numeral 1102 denotes a check data storage section for storing check data, which is used when adjusting the timing with which to latch data read out from a memory 1100.

Reference numeral 1103 denotes a write control section, which receives a mode selection signal. When the mode selection signal indicates a normal operation mode, the write control section 1103 writes input data to a predetermined address of the memory 1100. When the mode selection signal indicates a latch timing adjustment mode, the write control section 1103 writes data stored in the check data storage section 1102 to the memory 1100. Specifically, the write control section 1103 gives a timing signal s1103a, an address s1103b and data (input data or check data) s1103c to the memory 1100, thereby writing the data to a predetermined address of the memory 1100.

Reference numeral 1104 denotes a read control section, which receives the mode selection signal. Both in the normal operation mode and in the latch timing adjustment mode, the read control section 1104 gives a timing signal s1104a and an address signal s1104b to the memory 1100, thereby reading out a strobe signal DQS and data s1100 in synchronism with the signal DQS from the memory 1100. At the end of the latch timing adjustment mode, the read control section 1104 outputs a delay determination signal s1104c to a determination section 1108 and a delay control section 1109 to be described later.

Reference numeral 1105 denotes a delay selection section including a series of delay circuits 1051, 1052 to 105n and a selection section 1105a. The delay selection section 1105 delays the strobe signal DQS from the memory 1100 successively through the delay circuits 1051 to 105n to produce a plurality of delayed pulse signals with different delay amounts, and one of the outputs from the delay circuits 1051 to 105n is selected by the selection section 1105a.

Reference numeral 1106 denotes a latch circuit for receiving the data s1100 read out from the memory 1100 and receiving a delayed pulse signal from one of the delay circuits of the delay selection section 1105 selected by the selection section 1105a to latch the data s1100 read out from the memory 1100 in synchronism with the delayed pulse signal. In the normal operation mode, the data latched by the latch circuit 1106 is output from an output terminal 1101.

Reference numeral 1107 denotes a comparison circuit for comparing the readout data latched by the latch circuit 1106 with the corresponding data stored in the check data storage section 1102 to determine if the data match with each other.

Reference numeral 1108 denotes a determination section, which receives the delay determination signal from the read control section 1104 at the end of the latch timing adjustment mode. Based on a plurality of comparison results from the comparison circuit 1107, the determination section 1108 determines one of the delay circuits 1051 to 105n with which the readout data from the memory 1100 is appropriately latched by the latch circuit 1106, i.e., the determination section 1108 determines the delayed pulse signal with the optimal delay amount.

With the technique of the above-mentioned publication, the optimal latch timing for latching readout data from the memory 1100 is determined, thus realizing an automatic timing adjustment.

A strobe signal output from a memory is typically a signal that is added only when there is data to be read out, and is not a continuous signal such as a clock signal. Therefore, in a case where data in synchronism with such a strobe signal is input to, and used in, a semiconductor integrated circuit that operates based on a system clock, the data in synchronism with the strobe signal needs to be latched with the strobe signal and eventually latched again with the system clock.

However, a strobe signal and a system clock are signals of separate origins. Although the conventional latch timing adjustment apparatus adjusts the phase of the strobe signal so that readout data can be desirably latched with the strobe signal, a mislatch may occur when data, which has been latched with the strobe signal, is latched again with the system clock if there is a displacement in the phase relationship between the strobe signal and the system clock. Thus, the conventional apparatus may fail to perform a latch timing adjustment with a high precision.

SUMMARY OF THE INVENTION

It is therefore an object of the present invention to provide a latch timing adjustment method and a latch timing adjustment apparatus, wherein in a case where a semiconductor device such as a memory or an LSI outputs a strobe signal and data in synchronism with the strobe signal, the latch timing is adjusted so that the data can be latched with the strobe signal and desirably latched again with a system clock without a mislatch.

According to the present invention, in order to achieve the object set forth above, two different phase adjustments are performed, i.e., a phase adjustment performed between an external strobe signal and a system clock, and another phase adjustment performed between the external strobe signal and external data.

Specifically, a data latch timing adjustment method of the present invention is a data latch timing adjustment method for receiving an external strobe signal and external data in synchronism with the external strobe signal, latching the external data with the external strobe signal and then again latching the latched external data with a system clock, the method including: a system latch timing adjustment step of producing check data in synchronism with the external strobe signal and performing a phase adjustment between the external strobe signal and the system clock so that the check data is properly latched with the system clock; and a strobe latch timing adjustment step of performing a phase adjustment between the external strobe signal and the external data so that the external data is properly latched with the external strobe signal, the external strobe signal having a predetermined phase relationship with the system clock as a result of the phase adjustment performed in the system latch timing adjustment step.

In an embodiment of the present invention, in the system latch timing adjustment step: a plurality of delayed strobe signals are produced by delaying the external strobe signal with a plurality of delay amounts, and the check data is produced in synchronism with each delayed strobe signal; and one of the plurality of delayed strobe signals for which the corresponding check data is properly latched with the system clock is selected as an optimal strobe signal.

In an embodiment of the present invention, in the system latch timing adjustment step: the check data is produced in synchronism with the external strobe signal; a plurality of delayed system clocks are produced by delaying the system clock with a plurality of delay amounts, and the check data is latched with each of the plurality of delayed system clocks; and one of the plurality of delayed system clocks with which the check data is properly latched is selected as an optimal system clock.

In an embodiment of the present invention, in the strobe latch timing adjustment step: a plurality of delayed data are produced by delaying the external data with a plurality of delay amounts; the plurality of delayed data are latched with the external strobe signal; and one of the plurality of delayed data properly latched is selected as optimal data.

In an embodiment of the present invention, the system latch timing adjustment step and the strobe latch timing adjustment step are each performed when a predetermined timing adjustment request is issued; and a time at which the predetermined timing adjustment request is issued includes at least one of at a system startup, at a system initialization and during a normal operation.

In an embodiment of the present invention, the external strobe signal includes a plurality of bits; when the system latch timing adjustment step is requested at a system startup or at a system initialization, a plurality of delayed strobe signals are produced by delaying each bit of the external strobe signal with a plurality of delay amounts in the system latch timing adjustment step; and when the system latch timing adjustment step is requested during a normal operation, a plurality of delayed strobe signals are produced by delaying each of a predetermined number of bits of the external strobe signal with a plurality of delay amounts in the system latch timing adjustment step, the predetermined number of bits being less than the total number of bits of the external strobe signal.

In an embodiment of the present invention, the external data includes a plurality of bits; when the strobe latch timing adjustment step is requested at a system startup or at a system initialization, a plurality of delayed data are produced by delaying each bit of the external data with a plurality of delay amounts in the strobe latch timing adjustment step; and when the strobe latch timing adjustment step is requested during a normal operation, a plurality of delayed data are produced by delaying each of a predetermined number of bits of the external data with a plurality of delay amounts in the strobe latch timing adjustment step, the predetermined number of bits being less than the total number of bits of the external data.

A data latch timing adjustment apparatus of the present invention is a data latch timing adjustment apparatus for receiving an external strobe signal and external data in synchronism with the external strobe signal, latching the external data with the external strobe signal and then again latching the latched external data with a system clock, the apparatus including: a strobe delay selection section for delaying the external strobe signal with a plurality of delay amounts to produce a plurality of delayed strobe signals and selectively outputting one of the delayed strobe signals produced; a data delay selection section for delaying the external data with a plurality of delay amounts to produce a plurality of delayed data and selectively outputting one of the delayed data produced; a strobe latch section for receiving the delayed data from the data delay selection section and the delayed strobe signal selected by the strobe delay selection section to produce check data in synchronism with the delayed strobe signal and to latch the received delayed data or the produced check data in synchronism with the delayed strobe signal; a system latch section for latching, with the system clock, the delayed data or the check data latched by the strobe latch section; a strobe delay control section for controlling the strobe delay selection section; and a data delay control section for controlling the data delay selection section.

In an embodiment of the present invention, the data latch timing adjustment apparatus further includes: an expected value comparison section for comparing the delayed data or the check data latched by the system latch section with a corresponding expected value to determine whether or not the delayed data or the check data matches with the expected value; a strobe delay determination section for receiving a comparison result from the expected value comparison section and determining one of the plurality of delayed strobe signals produced in the strobe delay selection section to be an optimal strobe signal; and a data delay determination section for receiving a comparison result from the expected value comparison section and determining one of the plurality of delayed data produced in the data delay selection section to be optimal data.

Another data latch timing adjustment apparatus of the present invention is a data latch timing adjustment apparatus for receiving an external strobe signal and external data in synchronism with the external strobe signal, latching the external data with the external strobe signal and then again latching the latched external data with a system clock, the apparatus including: a clock delay selection section for delaying the system clock with a plurality of delay amounts to produce a plurality of delayed system clocks and selectively outputting one of the delayed system clocks produced; a strobe latch section for receiving the external data and the external strobe signal to produce check data in synchronism with the external strobe signal and to latch the received external data or the produced check data in synchronism with the external strobe signal; a system latch section for latching, with the delayed system clock selected by the clock delay selection section, the external data or the check data latched by the strobe latch section; and a clock delay control section for controlling the clock delay selection section.

In an embodiment of the present invention, the data latch timing adjustment apparatus further includes: a data delay selection section for delaying the external data with a plurality of delay amounts to produce a plurality of delayed data and selectively outputting one of the delayed data produced; and a data delay control section for controlling the data delay selection section.

In an embodiment of the present invention, the data latch timing adjustment apparatus further includes: an expected value comparison section for comparing the external data or the check data latched by the system latch section with a corresponding expected value to determine whether or not the external data or the check data matches with the expected value; a clock delay determination section for receiving a comparison result from the expected value comparison section and determining one of the plurality of delayed system clocks produced in the clock delay selection section to be an optimal system clock; and a data delay determination section for receiving a comparison result from the expected value comparison section and determining one of the plurality of delayed data produced in the data delay selection section to be optimal data.

In an embodiment of the present invention, the clock delay selection section includes: a fixed delay section for simultaneously producing a plurality of system clocks of different phases and selectively outputting one of the plurality of system clocks; and a variable delay section connected in series with the fixed delay section and including a series of delay circuits.

In an embodiment of the present invention, either one of the strobe delay control section and the data delay control section is provided and functions both as the strobe delay control section and as the data delay control section.

In an embodiment of the present invention, the external strobe signal is an n-bit (n is an integer greater than or equal to 2) signal; and a number n of the strobe delay selection sections are provided.

In an embodiment of the present invention, the expected value comparison section is used commonly in a strobe delay control operation and in a data delay control operation; either one of the strobe delay determination section and the data delay determination section is provided and functions both as the strobe delay determination section and as the data delay determination section; and different data can be selected as the check data in the strobe delay control operation and in the data delay control operation.

In an embodiment of the present invention, the expected value comparison section is used commonly in a clock delay control operation and in a data delay control operation; either one of the clock delay determination section and the data delay determination section is provided and functions both as the clock delay determination section and as the data delay determination section; and different data can be selected as the check data in the clock delay control operation and in the data delay control operation.

In an embodiment of the present invention, any data can be input from outside as the check data.

As described above, according to the present invention, a first phase adjustment is performed between the external strobe signal and the system clock, and a second phase adjustment is performed between the external strobe signal and the external data, whereby after the external data is latched with the external strobe signal, the latched data can be latched again with the system clock precisely without a mislatch. For example, in the first phase adjustment, the phase of one of the external strobe signal and the system clock may be adjusted while fixing the phase of the other so as to achieve an optimal phase relationship therebetween. Then, in the second phase adjustment, the phase of the external data can be adjusted with respect to the external strobe signal, which now has the optimal phase relationship with respect to the system clock, to achieve an optimal phase relationship therebetween. Then, the external data, which is in synchronism with the external strobe signal, can be properly latched with the system clock.

DETAILED DESCRIPTION OF THE INVENTION

Preferred embodiments of the present invention will now be described with reference to the accompanying drawings.

FIRST EMBODIMENT

Figure 1:
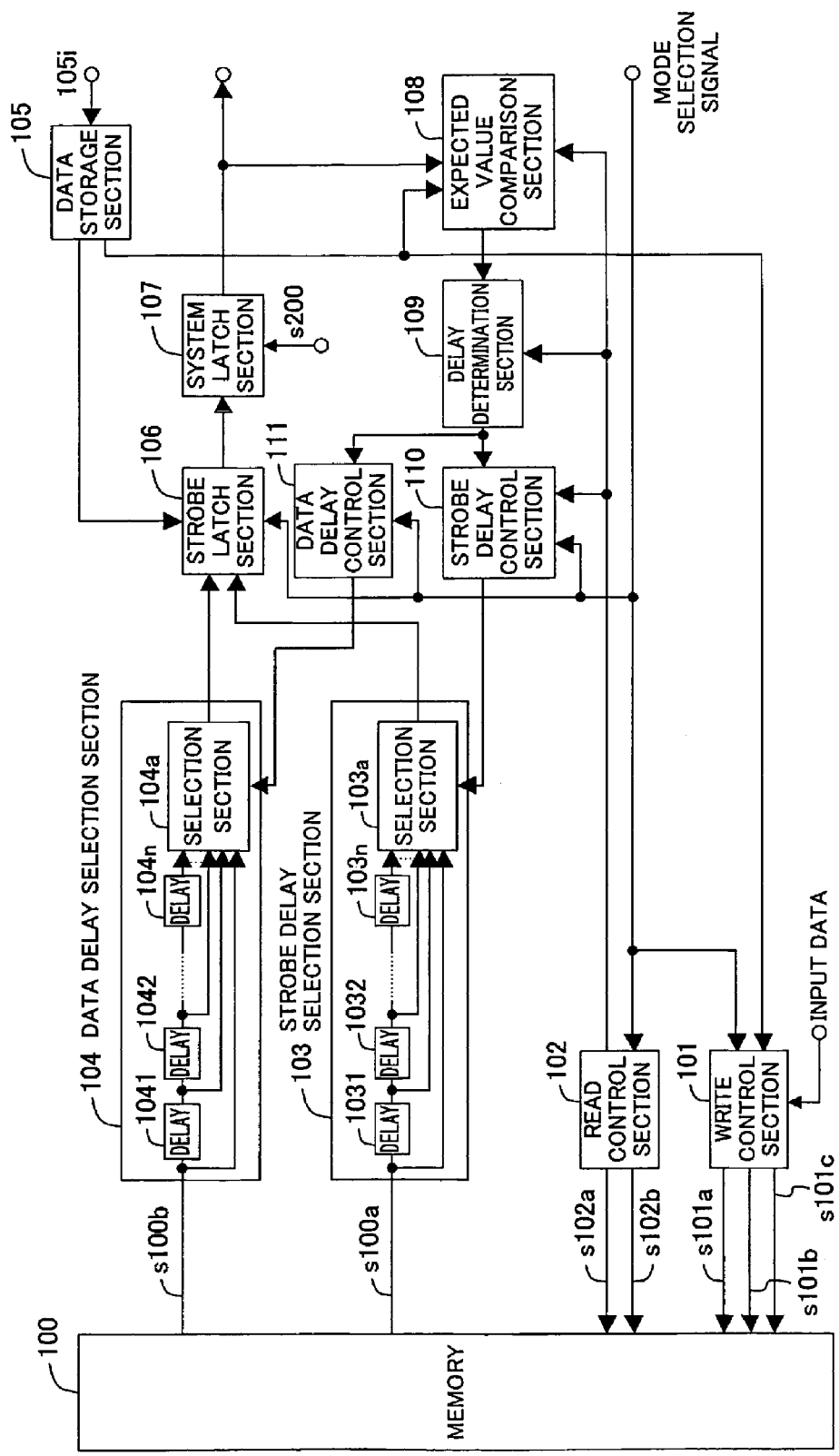
FIG. 1 is a block diagram showing a general configuration of a data latch timing adjustment apparatus according to a first embodiment of the present invention.

FIG. 1 shows a data latch timing adjustment apparatus according to a first embodiment of the present invention. Where a memory 100 outputs a strobe signal s100a and data s100b in synchronism with the strobe signal s100a, the latch timing adjustment apparatus shown in FIG. 1 adjusts the latch timing for the external data s100b. The latch timing adjustment apparatus is a single LSI including the circuits, and the like, other than the memory 100.

While the present embodiment is directed to a case where a latch timing adjustment is performed for the strobe signal s100a and the data s100b from the memory 100 as being the external strobe signal and the external data, it is understood that the present invention is also applicable to a case where a latch timing adjustment is performed for a strobe signal and data that are output from any source other than the memory 100, such as an LSI.

In FIG. 1, reference numeral 101 denotes a write control section and reference numeral 102 denotes a read control section. These control sections 101 and 102 receive a mode selection signal. When the mode selection signal indicates the latch timing adjustment mode, the control sections 101 and 102 control the memory 100 to output the strobe signal s100a and the predetermined external data s100b. These control sections will be described in detail after the description of other important circuit elements.

In FIG. 1, reference numeral 103 denotes a strobe delay selection section, including a series of delay circuits 1031, 1032 to 103n and a selection section 103a at the last stage. The strobe delay selection section 103 delays the strobe signal s100a from the memory 100 successively through the delay circuits 1031 to 103n to produce a plurality of delayed strobe signals with different delay amounts, and one of the outputs from the delay circuits 1031 to 103n is selected by the selection section 103a.

Reference numeral 104 denotes a data delay selection section, including a series of delay circuits 1041, 1042 to 104n and a selection section 104a at the last stage. The data delay selection section 104 delays the readout data s100b from the memory 100 successively through the delay circuits 1041 to 104n to produce a plurality of delayed data with different delay amounts, and one of the outputs from the delay circuits 1041 to 104n is selected by the selection section 104a.

Reference numeral 106 denotes a strobe latch section. In the system latch timing adjustment mode, the strobe latch section 106 successively receives a delayed strobe signal from one of the delay circuits selected by the selection section 103a of the strobe delay selection section 103, and produces check data in synchronism with each delayed strobe signal. In the system latch timing adjustment mode, a phase adjustment between the strobe signal and the system clock is performed, and it is therefore required that the strobe signal and the data are completely in synchronism with each other. Thus, even if the strobe latch section 106 receives delayed data from the data delay selection section 104, the strobe latch section 106 does not use the delayed data but separately produces check data. The check data is obtained by reading out data from a data storage section 105 and producing the same data as the readout data.

In the strobe latch timing adjustment mode, where a phase adjustment between the strobe signal s100a and the data s100b from the memory 100 is performed, the strobe latch section 106 successively receives delayed data from one of the delay circuits selected by the selection section 104a of the data delay selection section 104, and also receives an optimal strobe signal obtained as a result of the phase adjustment in the system latch timing adjustment mode, i.e., a delayed strobe signal from one of the delay circuits selected by the selection section 103a of the strobe delay selection section 103. The strobe latch section 106 latches each delayed data that it receives with the optimal strobe signal.

The data storage section 105 stores therein check data for use in a system latch timing adjustment and check data for use in a strobe latch timing adjustment, and outputs appropriate check data according to the adjustment mode. Note that these check data may be changed to any data that is input from outside via a port 105i by a control operation using an IIC register, for example. This allows one to change check data according to the environment after the system is mounted on a circuit board, or the like, thus enabling an optimal latch timing adjustment.

Reference numeral 107 denotes a system latch section for latching data, which has been latched by the strobe latch section 106, with a system clock s200. In the normal operation mode, the data latched by the system latch section 107 is used.

Reference numeral 108 denotes an expected value comparison section, which receives data latched by the system latch section 107. The expected value comparison section 108 compares the received data with the check data for system latch timing adjustment (expected value) stored in the data storage section 105 in the system latch timing adjustment mode, and compares the received data with the check data for strobe latch timing adjustment (expected value) stored in the data storage section 105 in the strobe latch timing adjustment mode, to output the comparison result indicating a match or a mismatch.

Reference numeral 109 denotes a delay determination section (the strobe delay determination section and the clock delay determination section). At the end of the system latch timing adjustment mode, the delay determination section 109 receives a delay determination signal from the read control section 102, and determines, based on a plurality of comparison results from the expected value comparison section 108, one of the delay circuits 1031 to 103n of the strobe delay selection section 103 with which the latched data from the strobe latch section 106 is properly latched by the system latch section 107, i.e., an optimal strobe signal with the optimal delay amount. At the end of the strobe latch timing adjustment mode, the delay determination section 109 receives a delay determination signal from the read control section 102, and determines, based on a plurality of comparison results from the expected value comparison section 108, one of the delay circuits 1041 to 104n of the data delay selection section 104 with which delayed data is properly latched by the strobe latch section 106, i.e., optimal data with the optimal delay amount.

A specific determination method used in the delay determination section 109 will now be described. If there is only one comparison result indicating a match among the plurality of comparison results from the expected value comparison section 108, a delayed strobe signal or delayed data from the corresponding delay circuit is determined to be optimal. If there are a series of comparison results indicating a match, a delayed strobe signal or delayed data from a delay circuit in the middle of the series of delay circuits corresponding to the series of comparison results, i.e., a delayed strobe signal or delayed data with a setup margin and a hold margin generally equal to each other, may be determined to be optimal. Alternatively, a delayed strobe signal or delayed data from one of the series of delay circuits with a larger setup margin or a larger hold margin may be determined to be optimal. Alternatively, in order to remove isolated points, the optimal delay may be determined based on the results from a number of consecutive comparison operations. For example, the delay determination section 109 may store the comparison results from a number of (e.g., five) consecutive comparison operations, and the selection of a delay circuit may be updated only if the same results occur a predetermined number of (e.g., three) consecutive times, or a predetermined number of (e.g., four) non-consecutive times.

In FIG. 1, reference numeral 110 denotes a strobe delay control section. During the period of the system latch timing adjustment mode, the strobe delay control section 110 controls the selection section 103a so as to successively select the delay circuits 1031 to 103n of the strobe delay selection section 103 starting from the first delay circuit 1031, and at the end of the system latch timing adjustment mode, the strobe delay control section 110 receives the delay determination signal from the read control section 102 to control the selection section 103a so as to select the optimal strobe signal being the output from one of the delay circuits 1031 to 103n of the strobe delay selection section 103 as determined by the delay determination section 109.

Reference numeral 111 denotes a data delay control section. During the period of the strobe latch timing adjustment mode, the data delay control section 111 controls the selection section 104a so as to successively select the delay circuits 1041 to 104n of the data delay selection section 104 starting from the first delay circuit 1041, and at the end of the strobe latch timing adjustment mode, the data delay control section 111 receives the delay determination signal from the read control section 102 to control the selection section 104a so as to select the optimal data being the output from one of the delay circuits 1041 to 104n of the data delay selection section 104 as determined by the delay determination section 109.

The write control section 101 receives the mode selection signal, and if the mode selection signal indicates the system latch timing adjustment mode, the write control section 101 writes predetermined data (e.g., a series of 0's or 1's) to the memory 100. If the mode selection signal indicates the strobe latch timing adjustment mode, the write control section 101 writes check data for strobe latch timing adjustment stored in the data storage section 105 to the memory 100. Note that in the normal operation mode, the write control section 101 writes input data to a predetermined address in the memory 100. Specifically, the write control section 101 gives a timing signal s101a, an address signal s101b and data s101c to the memory 100, thereby writing predetermined data to a predetermined address of the memory 100.

If the mode selection signal indicates the system latch timing adjustment mode or the strobe latch timing adjustment mode, the read control section 102 gives a timing signal s102a and a predetermined address signal s102b to the memory 100, thereby reading out the predetermined data s100b in synchronism with the strobe signal s100a from the memory 100, and outputs a read period signal and a delay determination signal to the expected value comparison section 108, the delay determination section 109 and the strobe delay control section 110. Note that also in the normal operation mode, the read control section 102 gives the timing signal s102a and the address signal s102b to the memory 100, thereby reading out the data s100b in synchronism with the strobe signal s100a from the memory 100.

A timing adjustment method used by the apparatus of FIG. 1 for adjusting the timing for latching data in synchronism with a strobe signal will now be described with reference to the drawings.

Figure 2:
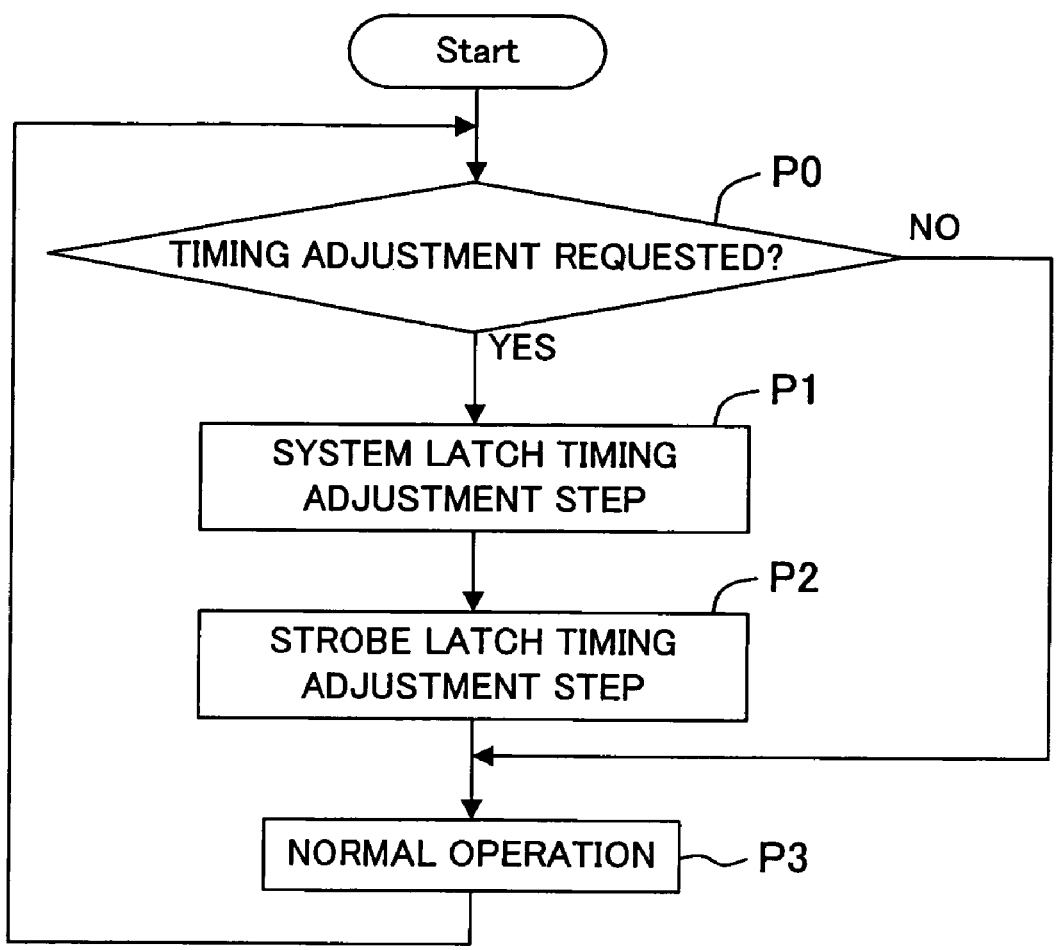
FIG. 2 is a flow chart showing a data latch timing adjustment method using the latch timing adjustment apparatus.

FIG. 2 is a flow chart generally showing the process of adjusting the timing with which data in synchronism with a strobe signal is latched with the system clock s200. The latch timing adjustment operation using the latch timing adjustment apparatus of the present embodiment will now be described referring to the flow chart.

Referring to FIG. 2, it is first determined in step P0 whether or not the mode selection signal is requesting a timing adjustment. If the timing adjustment mode is requested, the process proceeds to the system latch timing adjustment step of step P1. Following this step, the process proceeds to the strobe latch timing adjustment step of step P2, after which the process proceeds to the normal operation of step P3. Thereafter, the process repeats this loop. This allows for a timing adjustment such that the data s100b in synchronism with the strobe signal s100a is latched with the system clock s200 while following changes in the surrounding circumstances. The timing adjustment may be performed in such a manner that the system latch timing adjustment step is performed in response to a timing adjustment request, and the strobe latch timing adjustment step is performed in response to the next timing adjustment request.

Figure 3:
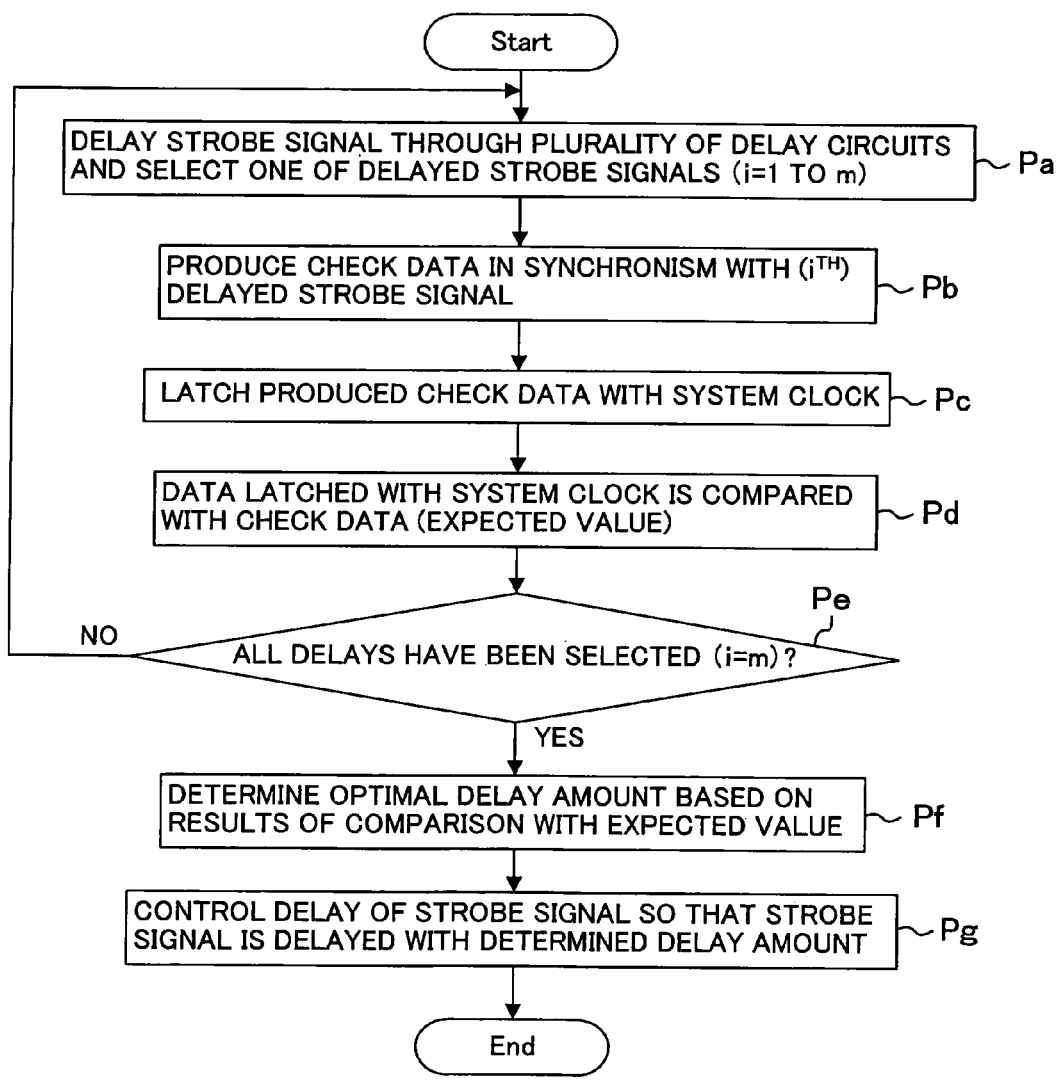
FIG. 3 is a flow chart showing in detail a system latch timing adjustment step in the latch timing adjustment method.

FIG. 3 is a flow chart showing the method of the system latch timing adjustment step P1. Referring to FIG. 3, in the system latch timing adjustment mode, predetermined data s101c, the address s101b indicating a location in the memory 100 where the data s101c is to be stored and the write timing signal s101a are given to the memory 100 from the write control section 101, thereby writing the data s101c to a predetermined address of the memory 100, in advance. Note that in the system latch timing adjustment mode, the strobe latch section 106 does not use readout data from the memory 100, but produces the same data as check data stored in the data storage section 105.

Then, the read control section 102 gives the address signal s102b indicating the address at which data was written previously, and the read timing signal s102a to the memory 100, thereby reading out the strobe signal s100a and the data s100b in synchronism with the strobe signal s100a from the memory 100. This operation is performed repeatedly so as to read the strobe signal s100a and the data s100b from the memory 100 a number of times. During this period, the strobe delay control section 110 receives a control signal from the read control section 102 to output a delay selection signal to the selection section 103a so as to successively select delayed strobe signals from the delay circuits 1031 to 103n of the strobe delay selection section 103, starting from the first delay circuit 1031, so that one delayed strobe signal is selected each time a strobe signal is read out from the memory 100 (step Pa).

As a result, the strobe latch section 106 receives the delayed strobe signal from the first delay circuit 1031 of the strobe delay selection section 103 and reads out check data from the data storage section 105 to produce the same data as the check data in synchronism with the delayed strobe signal. Then, in synchronism with the delayed strobe signal from the second delay circuit 1032 of the delay selection section 103, the strobe latch section 106 produces the second check data. Thereafter, the strobe latch section 106 produces $i^{th}$ check data in synchronism with the $i^{th}$ (i=3 to m) delayed strobe signal (step Pb).

In the system latch section 107, the check data produced by the strobe latch section 106 is latched with the system clock s200 (step Pc).

The expected value comparison section 108 compares the data latched by the system latch section 107 with the corresponding check data for system latch timing adjustment (expected value) from the data storage section 105 (step Pd), thus producing a comparison result indicating a match or a mismatch. This is repeated m times (step Pe).

At the end of the system latch timing adjustment, a delay determination signal is output from the read control section 102 to the delay determination section 109. Based on the plurality of comparison results from the expected value comparison section 108, the delay determination section 109 determines one of the delay circuits 1031 to 103n of the strobe delay selection section 103 with which data from the strobe latch section 106 is properly latched by the system latch section 107 (step Pf). After the optimal delay circuit, i.e., the optimal timing, is selected, the strobe delay control section 110 receives a delay determination signal from the read control section 102 to control the selection section 103a so as to select the output from one delay circuit selected by the delay determination section 109 as being the optimal strobe signal (step Pg).

Figure 4:
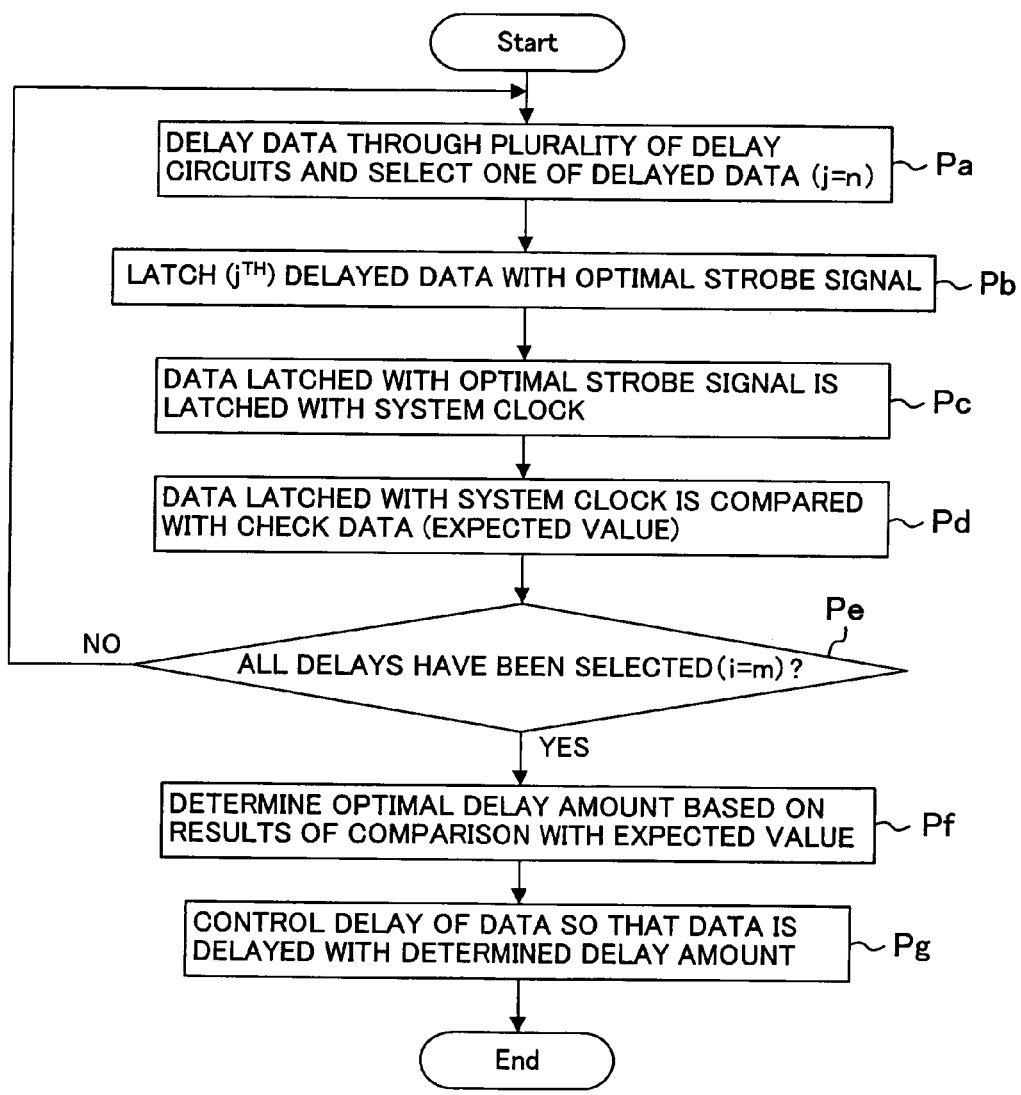
FIG. 4 is a flow chart showing in detail a strobe latch timing adjustment step in the latch timing adjustment method.

FIG. 4 is a flow chart showing the method of the strobe latch timing adjustment step P2.

Referring to FIG. 4, in the strobe latch timing adjustment mode, the check data s101c for strobe latch timing adjustment from the data storage section 105, the address s101b indicating a location in the memory 100 where the check data s101c is to be stored and the write timing signal s101a are given to the memory 100 from the write control section 101, thereby writing the data s101c to a predetermined address of the memory 100, in advance.

Then, the read control section 102 gives the address signal s102b indicating the address at which the check data was written previously, and the read timing signal s102a to the memory 100, thereby reading out the strobe signal s100a and the check data s100b in synchronism with the strobe signal s100a from the memory 100. This operation is performed repeatedly so as to successively read the check data from the memory 100 a number of times. During this period, the data delay control section 111 receives a control signal from the read control section 102 to output a delay selection signal to the selection section 104a so as to successively select delayed data from the delay circuits 1041 to 104n of the data delay selection section 104, starting from the first delay circuit 1041, so that one delayed data is selected each time check data is read out from the memory 100 (step Pa).

As a result, the strobe latch section 106 receives the optimal strobe signal from the strobe delay selection section 103, which has been determined in the system latch timing adjustment step, and the first delayed data from the first delay circuit 1041 of the data delay selection section 104, and latches the first delayed data in synchronism with the optimal strobe signal. Then, the strobe latch section 106 latches the delayed data from the second delay circuit 1042 of the data delay selection section 104 in synchronism with the optimal strobe signal. Thereafter, the strobe latch section 106 latches the j$^{th}$ (j=3 to n) delayed data in synchronism with the optimal strobe signal (step Pb).

In the system latch section 107, the data latched by the strobe latch section 106 is latched with the system clock s200 (step Pc).

The expected value comparison section 108 compares the data latched by the system latch section 107 with the corresponding check data for strobe latch timing adjustment (expected value) from the data storage section 105 (step Pd), thus producing a comparison result indicating a match or a mismatch. This is repeated n times (step Pe).

At the end of the strobe latch timing adjustment, a delay determination signal is output from the read control section 102 to the delay determination section 109. Based on the plurality of comparison results from the expected value comparison section 108, the delay determination section 109 determines one of the delay circuits 1041 to 104n of the data delay selection section 104 with which delayed data from the data delay selection section 104 is properly latched by the strobe latch section 106 (step Pf). After the optimal delay circuit, i.e., the optimal data, is selected, the data delay control section 111 receives a delay determination signal from the read control section 102 to control the selection section 104a so as to select the output from one delay circuit selected by the delay determination section 109 as being the optimal data (step Pg).

After the mode selection signal is changed to request the normal operation mode, the optimal delayed version of the readout data s100b from the memory 100 as selected by the selection section 104a of the data delay selection section 104 is latched by the strobe latch section 106 in synchronism with the optimal strobe signal selected by the selection section 103a of the strobe delay selection section 103, and then latched again by the system latch section 107 with the system clock s200, so as to be used in a normal operation.

Figure 5:
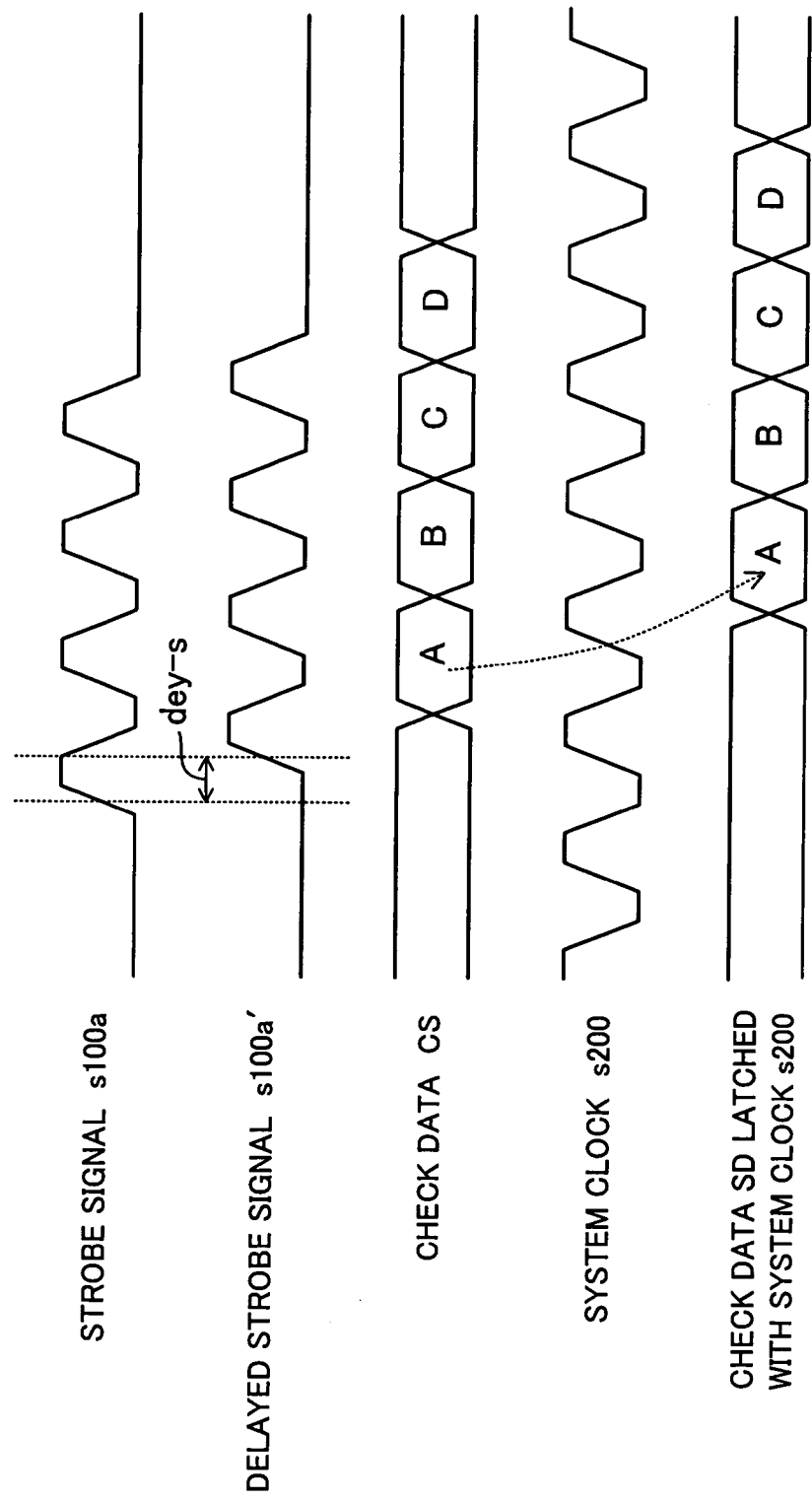
FIG. 5 is a timing diagram of the system latch timing adjustment step.

FIG. 5 is a timing diagram of the system latch timing adjustment step P1. Referring to FIG. 5, in the system latch timing adjustment step, a delayed strobe signal s100a' with a delay amount dey-s is produced from the strobe signal s100a read out from the memory. Then, check data CS is produced in the strobe latch section 106 in synchronism with the delayed strobe signal s100a' and latched with the system clock s200, and the latched check data SD is compared with the expected value.

Figure 6:
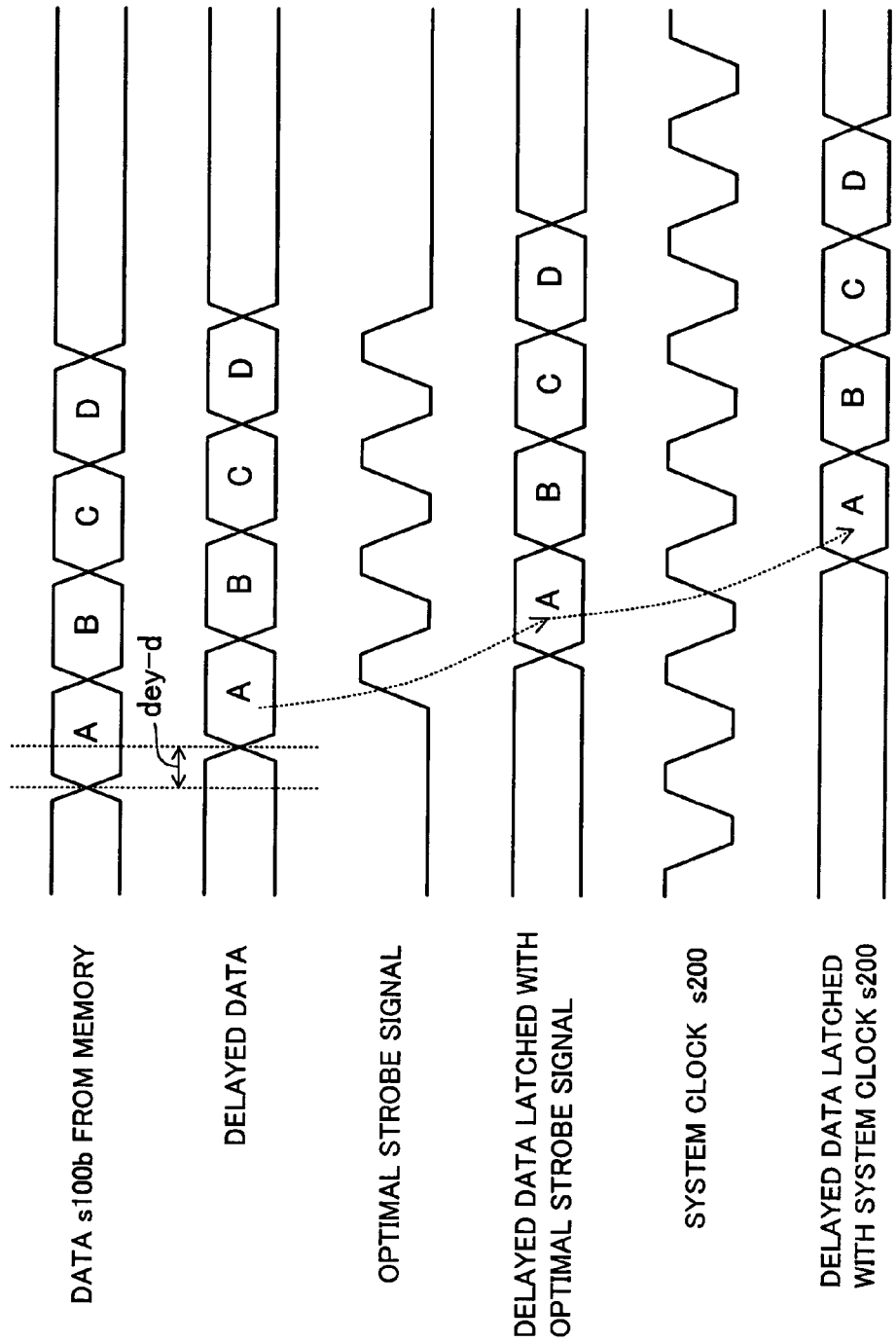
FIG. 6 is a timing diagram of the strobe latch timing adjustment step.

FIG. 6 is a timing diagram of the strobe latch timing adjustment step P2. Referring to FIG. 6, delayed data is produced from the data s100b read out from the memory 100. Then, the delayed data is latched by the strobe latch section 106 in synchronism with the optimal strobe signal, which is obtained through optimization in the system latch timing adjustment step P1, and then the latched delayed data is latched with the system clock s200. Then, the delayed data latched with the system clock s200 is compared with the expected value.

As described above, the latch timing adjustment step is divided into the system latch timing adjustment step and the strobe latch timing adjustment step. In the system latch timing adjustment step, an optimal strobe signal is obtained by the strobe delay selection section 103 such that the check data can properly be latched by the system latch section 107 with the system clock s200, without being dependent on the timing of readout data from the memory 100, thereby appropriately adjusting the phase relationship between the optimal strobe signal and the system clock s200. In the strobe latch timing adjustment step, the readout data s100b from the memory 100 is delayed variously through the data delay selection section 104 based on the optimal strobe signal to obtain the optimal data, thereby appropriately adjusting also the phase relationship between the optimal data and the optimal strobe signal. As a result, it is possible to precisely perform the adjustment of the timing with which the data s100b in synchronism with the strobe signal s100a from the memory 100 is latched with the system clock s200.

Moreover, in the present embodiment, the expected value comparison section 108 and the delay determination section 109 are used both in the strobe delay control operation and in the system clock delay control operation. Therefore, it is possible to suppress an increase in the circuit scale.

First Variation of First Embodiment

A first variation of the first embodiment will now be described with reference to FIG. 7.

In this variation, a delay control section 210 is used replacing the strobe delay control section 110 and the data delay control section 111.

Figure 7:
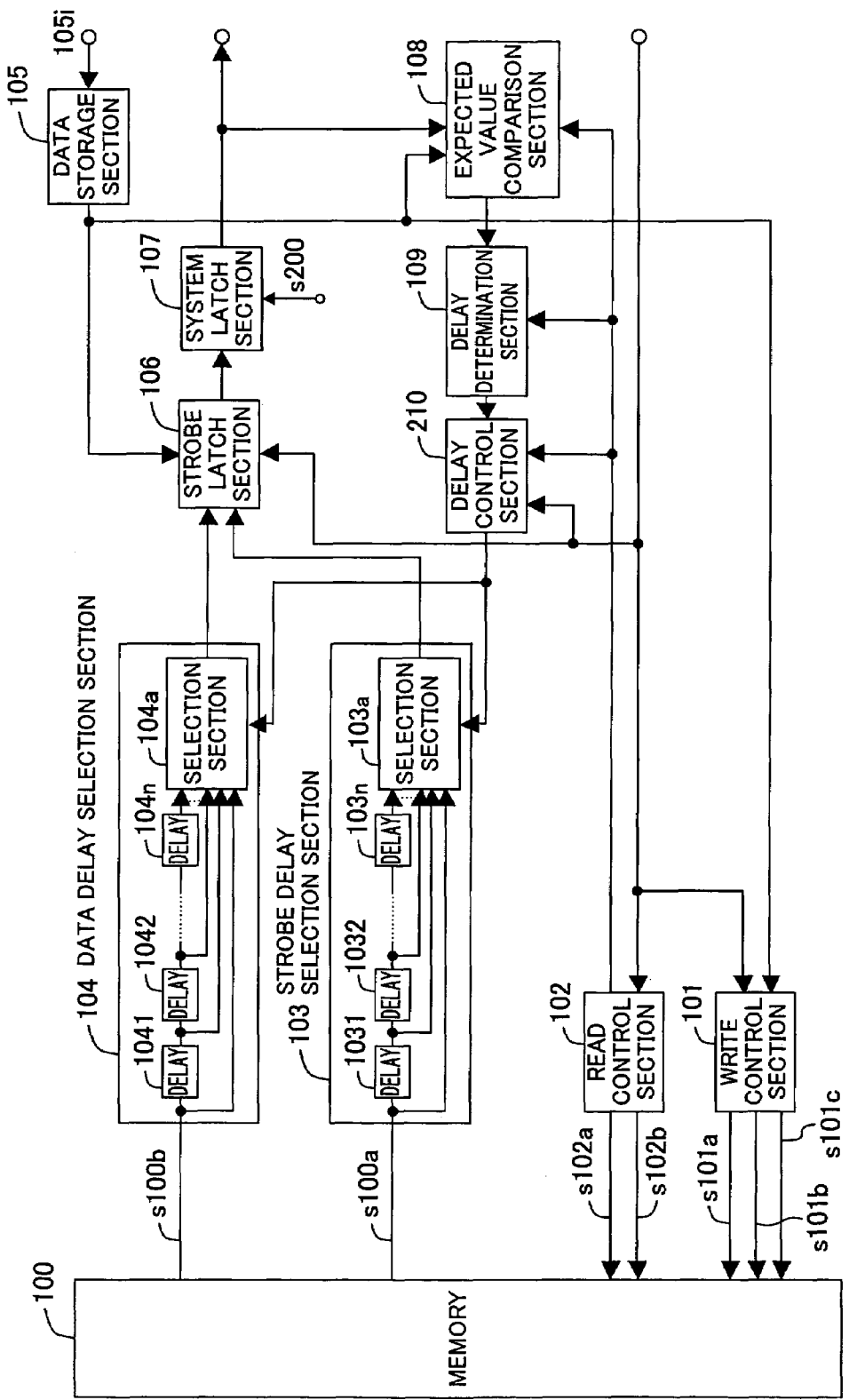
FIG. 7 is a block diagram showing a general configuration of a data latch timing adjustment apparatus according to a first variation of the first embodiment of the present invention.

Specifically, referring to FIG. 7, the delay control section 210 controls the strobe delay selection section 103 when the mode selection signal indicates the system latch timing adjustment mode, and controls the data delay selection section 104 when the mode selection signal indicates the strobe latch timing adjustment mode.

Therefore, in this variation, the delay control section 210 is used commonly in the strobe delay control operation and in the data delay control operation, whereby it is possible to realize a high-precision timing adjustment while suppressing an increase in the circuit scale.

Second Variation of First Embodiment

A second variation of the first embodiment will now be described with reference to FIG. 8.

This variation is directed to a case where a strobe signal s100a" from the memory 100 has m bits (m is an integer greater than or equal to 2), and readout data s100b" from the memory 100 has n bits (n is an integer greater than or equal to 2).

Figure 8:
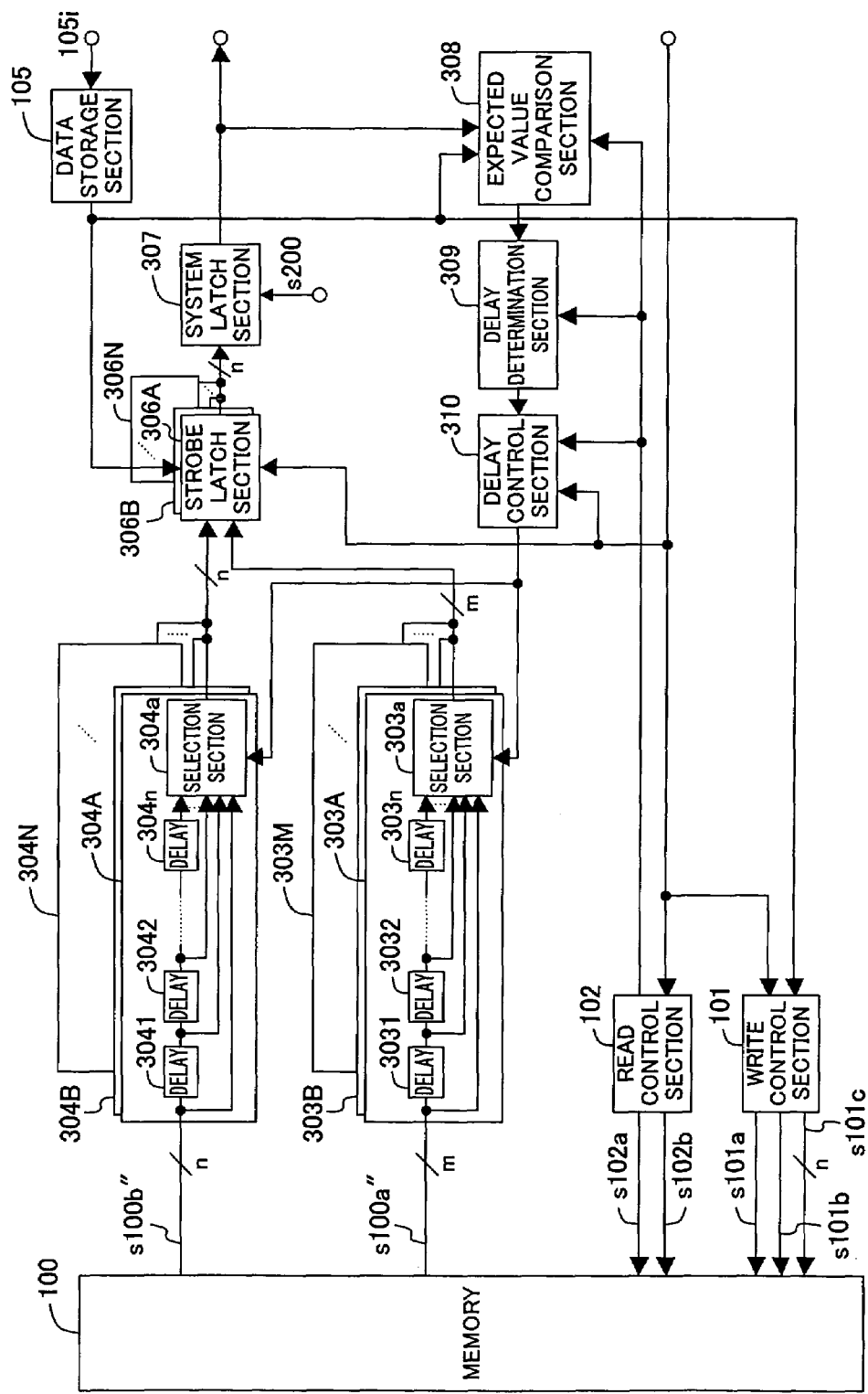
FIG. 8 is a block diagram showing a general configuration of a data latch timing adjustment apparatus according to a second variation of the first embodiment of the present invention.

In FIG. 8, the memory 100 outputs the m-bit strobe signal s100a" and the n-bit readout data s100b". For example, the strobe signal s100a" may have 4 bits, and the readout data s100b" may have 32 bits, wherein 1 bit of the strobe signal corresponds to 8 bits of the readout data. Accordingly, the apparatus includes a number m of strobe delay selection sections 303 for producing a delayed strobe signal for each of the m bits. Similarly, the apparatus includes a number n of data delay selection sections 304 for producing delayed data for each of the n bits.

The apparatus includes a number n of strobe latch sections 306 for latching the delayed data of the corresponding bits produced by the n data delay selection sections 304 with the delayed strobe signals of the corresponding bits produced by the m strobe delay selection sections 303, and for producing check data of the corresponding bits in synchronism with the delayed strobe signals selected by the selection sections 103a, ..., of the m strobe delay selection sections 303A to 303M.

A system latch section 307 latches data from the n bits of strobe latch sections 306A to 306N with the system clock s200.

In the system latch timing adjustment mode, an expected value comparison section 308 successively selects representative m bits of the n-bit data latched by the system latch section 307 on a bit-by-bit basis to compare the selected bit of the latched data with check data for system latch timing adjustment stored in the data storage section 105, outputting a comparison result indicating a match or a mismatch. In the strobe latch timing adjustment, the expected value comparison section 308 successively selects n bits of data latched by the system latch section 307 to compare the selected bit of the latched data with check data for strobe latch timing adjustment stored in the data storage section 105, outputting a comparison result indicating a match or a mismatch.

A delay determination section 309 determines the optimal data and the optimal strobe signal, as in the first embodiment.

During the period of the system latch timing adjustment mode, a delay control section 310 controls a selection section 303a so as to successively select a plurality of delay circuits 3031 to 303n in a strobe delay selection section 303 of the bit for which the adjustment is being performed, starting from the first delay circuit 3031. At the end of the system latch timing adjustment mode, the delay control section 310 receives the delay determination signal from the read control section 102 to control the selection section 303a so as to select the output from a delay circuit selected by the delay determination section 309, i.e., the optimal strobe signal. During the period of the strobe latch timing adjustment mode, the delay control section 310 controls a selection section 304a so as to successively select a plurality of delay circuits 3041 to 304n in a data delay selection section 304 of the bit for which the adjustment is being performed, starting from the first delay circuit 3041. At the end of the strobe latch timing adjustment mode, the delay control section 310 receives the delay determination signal from the read control section 102 to control the selection section 304a so as to select the output from a delay circuit selected by the delay determination section 309, i.e., the optimal data.

Therefore, according to this variation, where the strobe signal s100a" from the memory 100 has 4 bits (m=4) and the readout data s100b" has 32 bits (n=32), for example, in the system latch timing adjustment step, representative 4 bits of check data produced from the 4-bit delayed strobe signal are latched with the system clock s200, and are successively subjected to the comparison with an expected value, the delay determination operation and the strobe delay control operation on a bit-by-bit basis and, in the following strobe latch timing adjustment step, the 32 bits of the readout data are latched by 8 bits with the corresponding optimized delayed strobe signal, and are successively subjected to the comparison with an expected value, the delay determination and the strobe delay control operation on a bit-by-bit basis.

Note that if a plurality of expected value comparison sections 308 are provided, a plurality of bits may be parallelly subjected to the comparison with an expected value and the subsequent operations.

Figure 9:
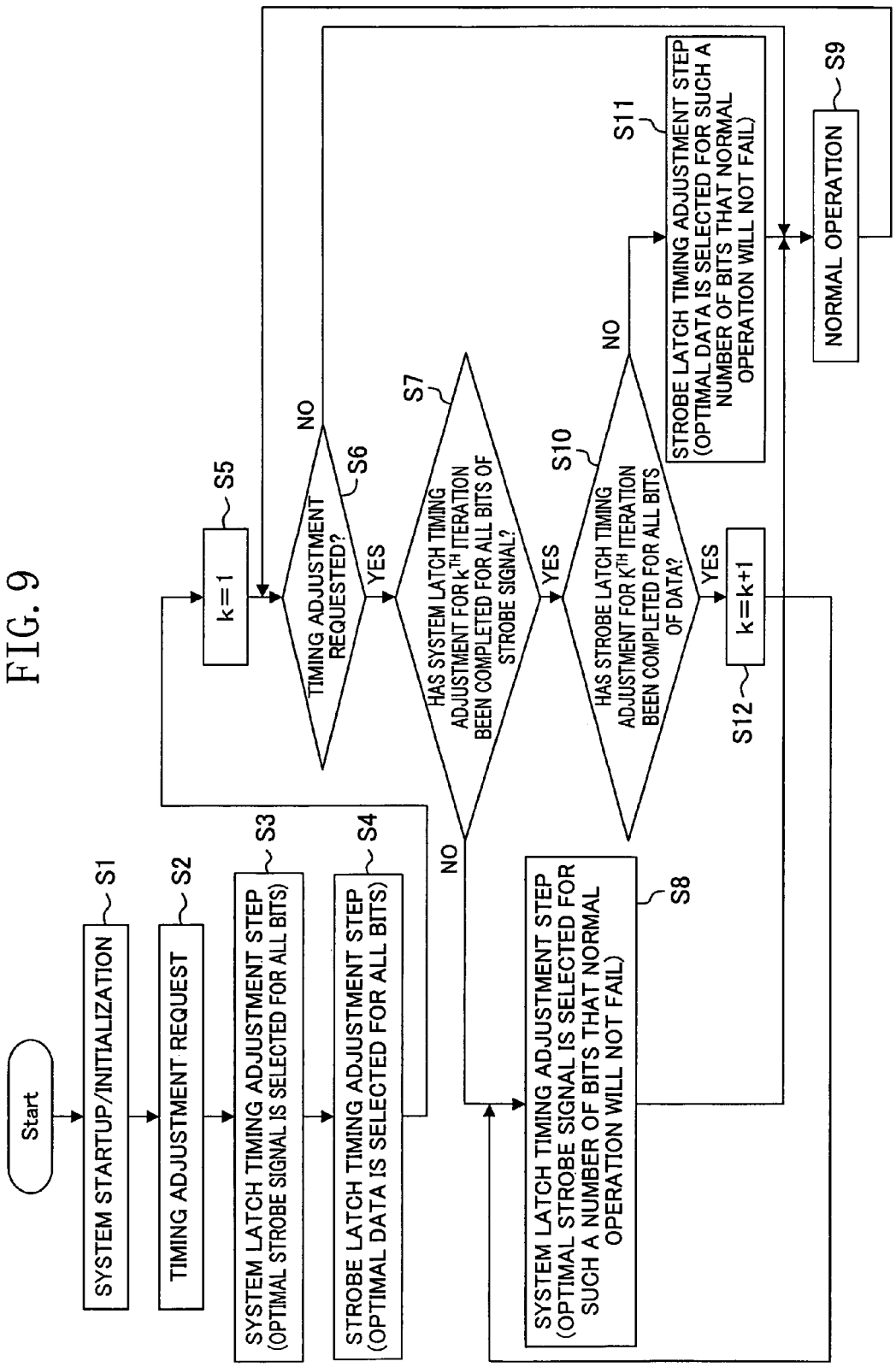
FIG. 9 is a flow chart showing a data timing adjustment method using the latch timing adjustment apparatus.

FIG. 9 is a flow chart showing the latch timing adjustment method in a case where it is not possible to subject all bits at once to a timing adjustment operation due to a limitation on the data transfer rate of the memory, or the like.

In such a case, the system latch timing adjustment and the strobe latch timing adjustment are performed consecutively for all bits in response to a single timing adjustment request only when the normal operation will not be affected, e.g., at the system startup or at the system initialization (steps S1 to S4). Thereafter, during the normal operation, the latch timing adjustment operation is performed as follows.

In response to a timing adjustment request, the system latch timing adjustment step (steps S5 to S9) is performed only for such a number bits that the normal operation will not be affected, whereby the system latch timing adjustment step for all bits of the strobe signal is completed through a plurality of timing adjustment requests (iterations of steps S5 to S9).

Then, the strobe latch timing adjustment step (steps S10 to S11) is performed only for such a number of bits that the normal operation will not be affected in response to a timing adjustment request, and the strobe latch timing adjustment step for all bits of the data is completed through a plurality of timing adjustment requests (iterations of steps S10 to S11).

Thereafter, the system latch timing adjustment step and the strobe latch timing adjustment step are repeatedly performed in response to timing adjustment requests.

Note that the timing adjustment request may be issued constantly immediately after the system startup or at the system initialization, for example. Where the normal operation is required with synchronous or asynchronous timing, arbitration may be performed between the timing adjustment request and the normal operation request based on a predetermined order of priority so that the timing adjustment request is issued only when it has a higher priority.

SECOND EMBODIMENT

A data latch timing adjustment apparatus according to a second embodiment of the present invention will now be described with reference to the drawings.

Figure 10:
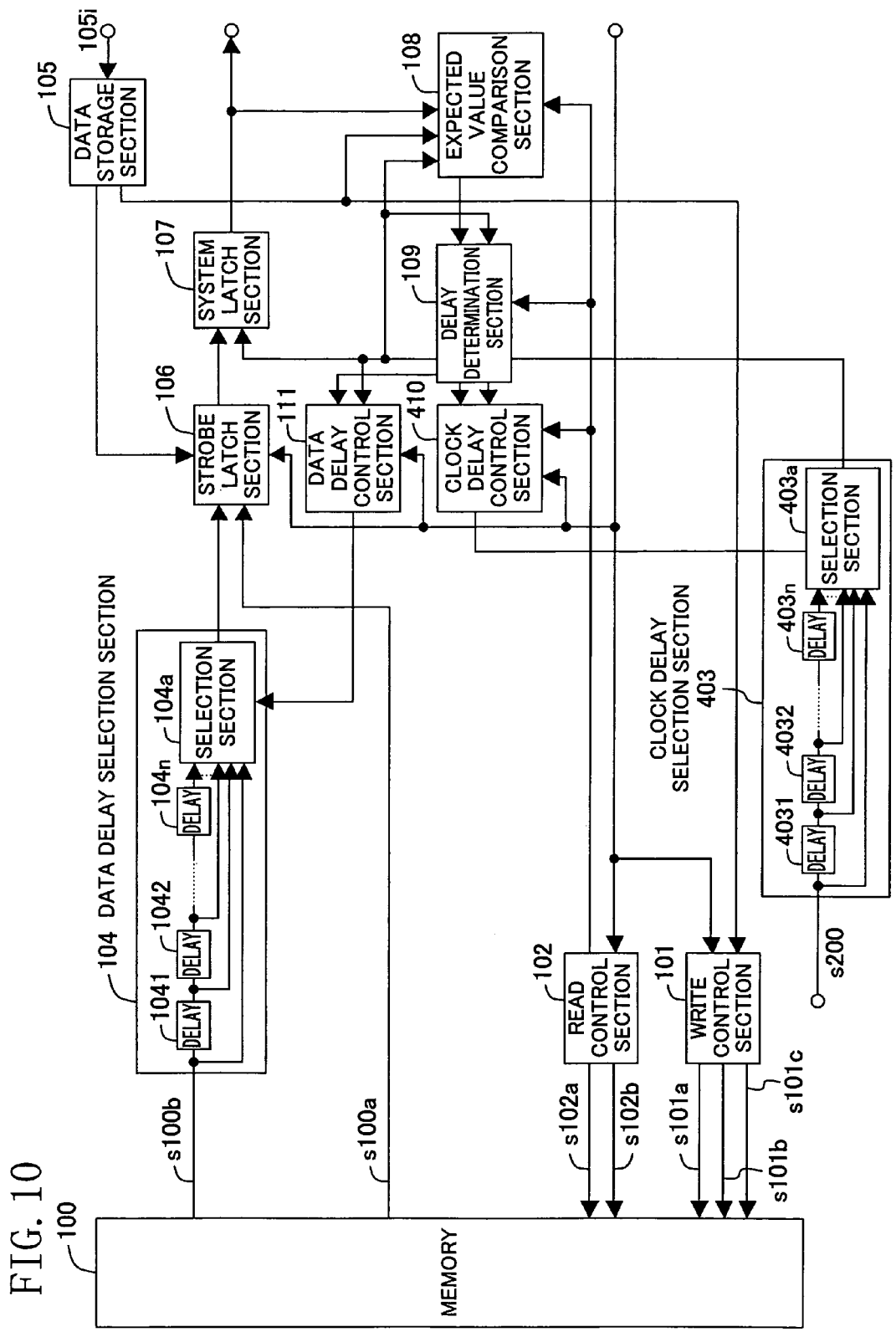
FIG. 10 is a block diagram showing a general configuration of a data latch timing adjustment apparatus according to a second embodiment of the present invention.

FIG. 10 shows the apparatus of the second embodiment for adjusting the timing for latching data in synchronism with a strobe signal.

In the present embodiment, a clock delay selection section 403 is provided in place of the strobe delay selection section 103, and a clock delay control section 410 is provided in place of the strobe delay control section 110.

Thus, while the phase adjustment between the external strobe signal and the system clock is performed by delaying the external strobe signal by the strobe delay selection section 103 in the previous embodiment, the phase adjustment is performed by delaying the system clock by the clock delay selection section 403 in the present embodiment.

More specifically, in the system latch timing adjustment step with the configuration of FIG. 1 described above, a delay control signal from the strobe delay control section 110 is used to control the strobe delay selection section 103 so as to select the optimal delayed strobe from among a plurality of delayed strobe signals produced from a strobe signal. In contrast, in the system latch timing adjustment step of the present embodiment, a delay control signal from the clock delay control section 410 is used to control the clock delay selection section 403 so as to select the optimal delayed clock from among a plurality of delayed clock signals produced from the system clock s200. If there is a possibility that the strobe signal from the memory 100 might arrive at the latch section earlier than the data, it is preferred that the strobe signal is delayed so that the delayed strobe signal will arrive later than the data. Moreover, the adjusted delayed system clock is supplied only to circuits subsequent to the section for reading out data from the memory 100, and if the clock for latching data needs to be switched from the system clock s200 to a delayed system clock, the data can be latched with a delayed system clock obtained by delaying the system clock s200 by substantially the same delay amount as that introduced by the clock delay selection section 403.

Otherwise, the configuration is similar to that shown in FIG. 1 and will not be further described below.

Figure 11:
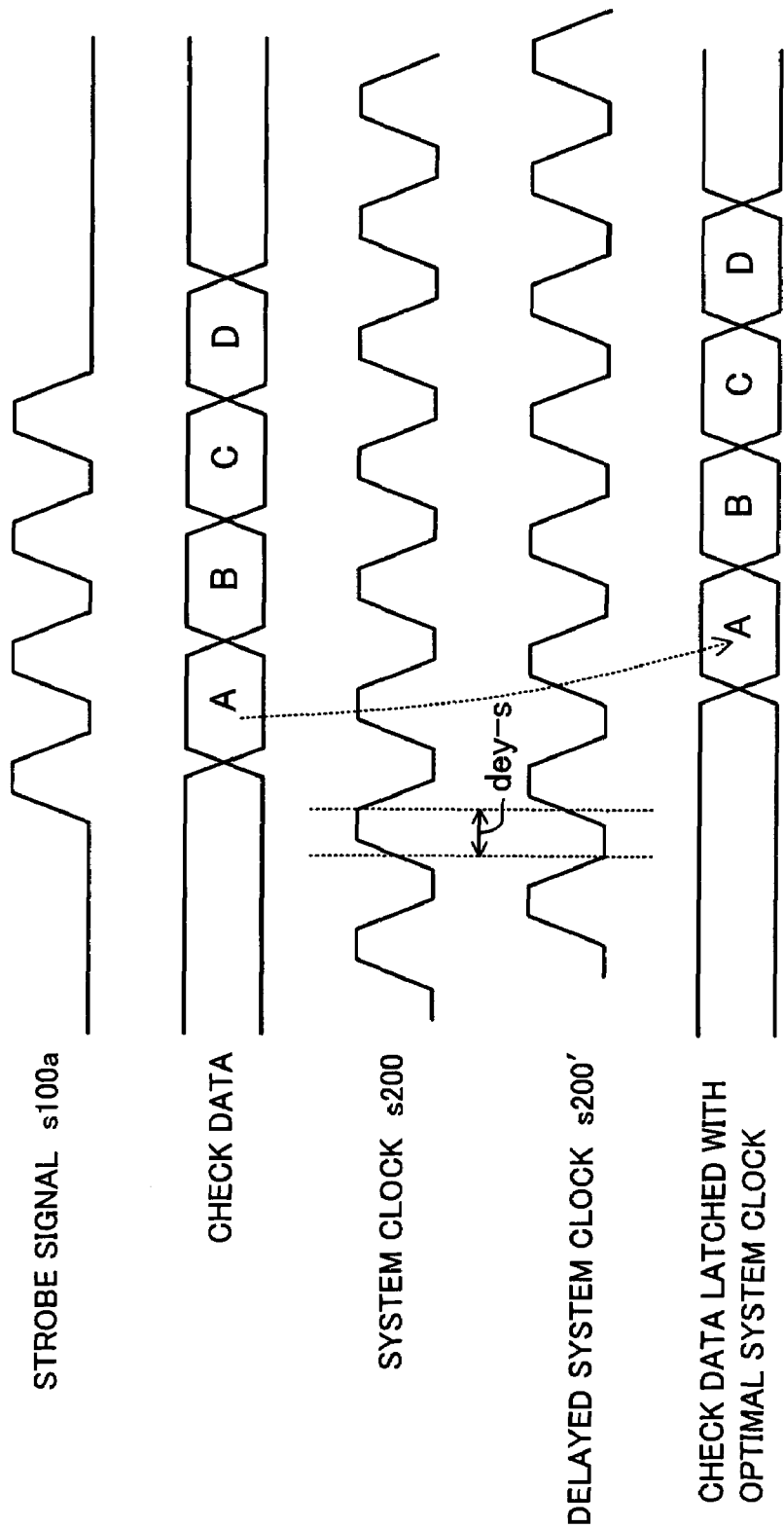
FIG. 11 is a timing diagram of a system latch timing adjustment step in the latch timing adjustment method.

FIG. 11 is a timing diagram of the system latch timing adjustment step of the second embodiment.

In the system latch timing adjustment step, a delayed system clock s200' with a delay amount dey-s is produced from the system clock s200. The strobe latch section 106 produces check data in synchronism with the strobe signal s100a from the memory 100, and the check data is latched with the delayed system clock s200'. The check data latched with the delayed system clock s200' is compared with an expected value in the expected value comparison section 108.

Thus, the present embodiment provides similar functions and effects to those of the first embodiment. Moreover, in the present embodiment, the system clock s200 supplied to circuits subsequent to the section for reading out data from the memory 100 is delayed, whereby it is possible to make such an adjustment that even accommodates delays occurring in the memory 100 and the circuit board.

Although not shown in the drawings, it is understood that modifications as shown in FIG. 7 and FIG. 8 may be made to the configuration of the present embodiment shown in FIG. 10.

First Variation of Second Embodiment

A first variation of the second embodiment will now be described with reference to FIG. 12.

In this variation, a change is made to the configuration of the clock delay selection section 403 shown in FIG. 10.

Figure 12:
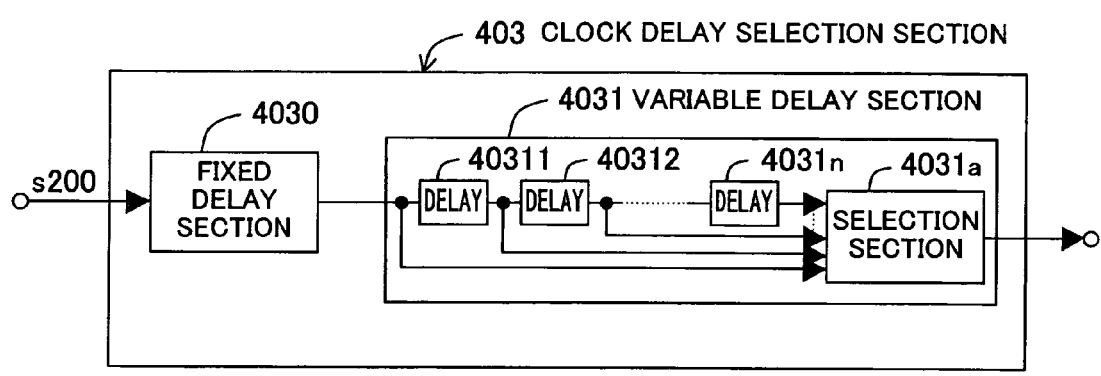
FIG. 12 shows an internal configuration of a clock delay selection section provided in a data latch timing adjustment apparatus according to a first variation of the second embodiment of the present invention.
Figure 13:
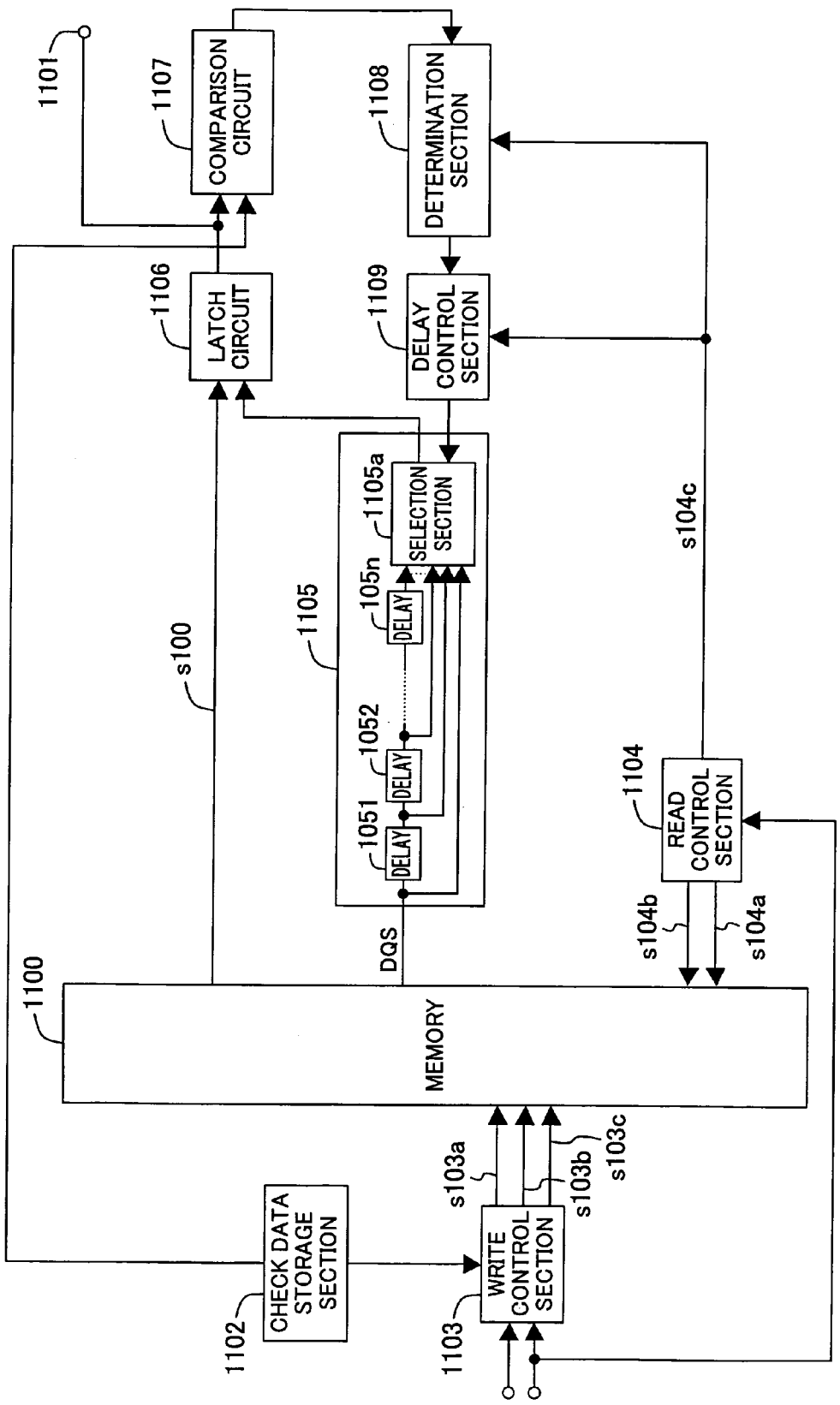
FIG. 13 is a block diagram showing a general configuration of a conventional data latch timing adjustment apparatus.

Specifically, referring to FIG. 12, the clock delay selection section 403 of this variation includes a fixed delay section 4030 and a variable delay section 4031.

The fixed delay section 4030 receives the system clock s200, and simultaneously produces a plurality of system clocks of different phases from the system clock s200 to selectively output one of the system clocks. Different phases of the system clock s200 can be easily produced by using a PLL circuit or a DLL circuit, for example.

The variable delay section 4031 includes a series of delay circuits 40311, 40312 to 4031n and a selection section 4031a. The variable delay section 4031 delays a system clock of a phase selected by the fixed delay section 4030 successively through the delay circuits 40311 to 4031n to produce a plurality of delayed system clocks with different delay amounts, and one of the outputs from the delay circuits 40311 to 4031n is selected by the selection section 4031a.

Therefore, the delay amount for the delayed system clock can be increased by significantly shifting the clock phase in advance at the fixed delay section 4030, thus realizing a fixed delay that is not affected by variations in the ambient temperature or the voltage. Moreover, a fine adjustment of the delay amount done in the variable delay section 4031 enables a timing adjustment with an even higher precision.

What is claimed is:

1. A data latch timing adjustment method for receiving an external strobe signal and external data in synchronism with the external strobe signal, latching the external data with the external strobe signal and then again latching the latched external data with a system clock, the method comprising:
   a system latch timing adjustment step of producing check data in synchronism with the external strobe signal and performing a phase adjustment between the external strobe signal and the system clock so that the check data is properly latched with the system clock; and
   a strobe latch timing adjustment step of performing a phase adjustment between the external strobe signal and the external data so that the external data is properly latched with the external strobe signal, the external strobe signal having a predetermined phase relationship with the system clock as a result of the phase adjustment performed in the system latch timing adjustment step.

2. The data latch timing adjustment method of claim 1, wherein in the system latch timing adjustment step:
   a plurality of delayed strobe signals are produced by delaying the external strobe signal with a plurality of delay amounts, and the check data is produced in synchronism with each delayed strobe signal; and
   one of the plurality of delayed strobe signals for which the corresponding check data is properly latched with the system clock is selected as an optimal strobe signal.

3. The data latch timing adjustment method of claim 1, wherein in the system latch timing adjustment step:
   the check data is produced in synchronism with the external strobe signal;

a plurality of delayed system clocks are produced by delaying the system clock with a plurality of delay amounts, and the check data is latched with each of the plurality of delayed system clocks; and one of the plurality of delayed system clocks with which the check data is properly latched is selected as an optimal system clock.

4. The data latch timing adjustment method of claim 1, wherein in the strobe latch timing adjustment step:

a plurality of delayed data are produced by delaying the external data with a plurality of delay amounts;

the plurality of delayed data are latched with the external strobe signal; and one of the plurality of delayed data properly latched is selected as optimal data.

5. The data latch timing adjustment method of claim 1, wherein:

the system latch timing adjustment step and the strobe latch timing adjustment step are each performed when a predetermined timing adjustment request is issued; and a time at which the predetermined timing adjustment request is issued includes at least one of at a system startup, at a system initialization and during a normal operation.

6. The data latch timing adjustment method of claim 2, wherein:

the external strobe signal includes a plurality of bits;

when the system latch timing adjustment step is requested at a system startup or at a system initialization, a plurality of delayed strobe signals are produced by delaying each bit of the external strobe signal with a plurality of delay amounts in the system latch timing adjustment step; and when the system latch timing adjustment step is requested during a normal operation, a plurality of delayed strobe signals are produced by delaying each of a predetermined number of bits of the external strobe signal with a plurality of delay amounts in the system latch timing adjustment step, the predetermined number of bits being less than the total number of bits of the external strobe signal.

7. The data latch timing adjustment method of claim 4, wherein:

the external data includes a plurality of bits;

when the strobe latch timing adjustment step is requested at a system startup or at a system initialization, a plurality of delayed data are produced by delaying each bit of the external data with a plurality of delay amounts in the strobe latch timing adjustment step; and when the strobe latch timing adjustment step is requested during a normal operation, a plurality of delayed data are produced by delaying each of a predetermined number of bits of the external data with a plurality of delay amounts in the strobe latch timing adjustment step, the predetermined number of bits being less than the total number of bits of the external data.

8. A data latch timing adjustment apparatus for receiving an external strobe signal and external data in synchronism with the external strobe signal, latching the external data with the external strobe signal and then again latching the latched external data with a system clock, the apparatus comprising:

a strobe delay selection section for delaying the external strobe signal with a plurality of delay amounts to produce a plurality of delayed strobe signals and selectively outputting one of the delayed strobe signals produced;

a data delay selection section for delaying the external data with a plurality of delay amounts to produce a plurality of delayed data and selectively outputting one of the delayed data produced;

a strobe latch section for receiving the delayed data from the data delay selection section and the delayed strobe signal selected by the strobe delay selection section to produce check data in synchronism with the delayed strobe signal and to latch the received delayed data or the produced check data in synchronism with the delayed strobe signal;

a system latch section for latching, with the system clock, the delayed data or the check data latched by the strobe latch section;

a strobe delay control section for controlling the strobe delay selection section; and a data delay control section for controlling the data delay selection section.

9. The data latch timing adjustment apparatus of claim 8, further comprising:

an expected value comparison section for comparing the delayed data or the check data latched by the system latch section with a corresponding expected value to determine whether or not the delayed data or the check data matches with the expected value;

a strobe delay determination section for receiving a comparison result from the expected value comparison section and determining one of the plurality of delayed strobe signals produced in the strobe delay selection section to be an optimal strobe signal; and a data delay determination section for receiving a comparison result from the expected value comparison section and determining one of the plurality of delayed data produced in the data delay selection section to be optimal data.

10. The data latch timing adjustment apparatus of claim 9, wherein any data can be input from outside as the check data.

11. The data latch timing adjustment apparatus of claim 8, wherein either one of the strobe delay control section and the data delay control section is provided and functions both as the strobe delay control section and as the data delay control section.

12. The data latch timing adjustment apparatus of claim 8, wherein:

the external strobe signal is an n-bit (n is an integer greater than or equal to 2) signal; and a number n of the strobe delay selection sections are provided.

13. The data latch timing adjustment apparatus of claim 9, wherein:

the expected value comparison section is used commonly in a strobe delay control operation and in a data delay control operation;

either one of the strobe delay determination section and the data delay determination section is provided and functions both as the strobe delay determination section and as the data delay determination section; and different data can be selected as the check data in the strobe delay control operation and in the data delay control operation.

14. The data latch timing adjustment apparatus of claim 8, wherein any data can be input from outside as the check data.

* * * * *